(12) United States Patent
Zheng et al.

(10) Patent No.: US 12,520,535 B2
(45) Date of Patent: Jan. 6, 2026

(54) THIN FILM TRANSISTOR INCLUDING ACTIVE LAYER HETEROSTRUCTURE METHOD OF MANUFACTURING SAME, AND DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventors: Hui Zheng, Hubei (CN); Wenxu Xianyu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 528 days.

(21) Appl. No.: 17/759,849

(22) PCT Filed: Jul. 11, 2022

(86) PCT No.: PCT/CN2022/104815
§ 371 (c)(1),
(2) Date: Jul. 29, 2022

(87) PCT Pub. No.: WO2024/000631
PCT Pub. Date: Jan. 4, 2024

(65) Prior Publication Data
US 2024/0186421 A1   Jun. 6, 2024

(30) Foreign Application Priority Data
Jun. 30, 2022   (CN) .......................... 202210767688.0

(51) Int. Cl.
*H10D 30/67* (2025.01)
*H10D 30/01* (2025.01)
(Continued)

(52) U.S. Cl.
CPC ....... *H10D 30/6755* (2025.01); *H10D 30/031* (2025.01); *H10D 30/6729* (2025.01);
(Continued)

(58) Field of Classification Search
CPC ............... H01L 29/267; H01L 29/4908; H01L 29/7813; H01L 29/7869
(Continued)

(56) References Cited

U.S. PATENT DOCUMENTS 4,697,197 A   9/1987   Dresner
5,461,250 A   10/1995   Burghartz
(Continued)

FOREIGN PATENT DOCUMENTS

CN   103715269 A       4/2014
CN   106252395 A   *   12/2016   ............. H01L 29/41
(Continued)

OTHER PUBLICATIONS

International Search Report in International application No. PCT/CN2022/104815, mailed on Dec. 19, 2022.
(Continued)

*Primary Examiner* — Norman D Richards
(74) *Attorney, Agent, or Firm* — PV IP PC; Wei Te Chung (57) ABSTRACT

The present disclosure provides a thin film transistor and a method of manufacturing the same, wherein the thin film transistor at least comprises a first gate electrode, a first insulating layer, an active layer, a source electrode and a drain electrode, a second insulating layer covering the active layer, the source electrode and the drain electrode, and a (Continued)

second gate electrode, wherein the active layer comprises a first active layer, a second active layer on the first active layer, and a third active layer on the second active layer; wherein the first active layer, the second active layer, and the third active layer may form a heterostructure.

18 Claims, 6 Drawing Sheets

(51) Int. Cl.
*H10D 86/40* (2025.01)
*H10D 86/60* (2025.01)

(52) U.S. Cl.
CPC ....... *H10D 30/6739* (2025.01); *H10D 86/441* (2025.01); *H10D 86/60* (2025.01)

(58) Field of Classification Search
USPC .......................................................... 257/43
See application file for complete search history.

(56) References Cited

U.S. PATENT DOCUMENTS

| | | | | |
|---|---|---|---|---|
| 2014/0203289 | A1* | 7/2014 | Liu | H01L 29/7787 |
| | | | | 438/172 |
| 2017/0288023 | A1* | 10/2017 | Yamazaki | H01L 29/66045 |
| 2019/0115474 | A1* | 4/2019 | Yamazaki | H01L 29/78696 |

FOREIGN PATENT DOCUMENTS

| | | |
|---|---|---|
| CN | 107546125 A | 1/2018 |
| CN | 108122932 A | 6/2018 |
| CN | 110277446 A | 9/2019 |
| CN | 112750913 A | 5/2021 |
| CN | 114122145 A | 3/2022 |
| KR | 20170021472 A | 2/2017 |

OTHER PUBLICATIONS

Written Opinion of the International Search Authority in International application No. PCT/CN2022/104815, mailed on Dec. 19, 2022.
Chinese Office Action issued in corresponding Chinese Patent Application No. 202210767688.0 dated Apr. 17, 2025, pp. 1-6.
Chinese Office Action issued in corresponding Chinese Patent Application No. 202210767688.0 dated Jul. 30, 2025, pp. 1-7.
Chinese Office Action issued in corresponding Chinese Patent Application No. 202210767688.0 dated Sep. 15, 2025, pp. 1-4.

* cited by examiner

THIN FILM TRANSISTOR INCLUDING ACTIVE LAYER HETEROSTRUCTURE METHOD OF MANUFACTURING SAME, AND DISPLAY PANEL

TECHNICAL FIELD

The present disclosure relates to the field of display technology, and in particular, to a thin film transistor, a method of manufacturing the same, and a display panel.

BACKGROUND

In existing display panels, thin film transistors (TFTs) are generally manufactured by using a low temperature polysilicon (LTPS) process. Alternatively, thin film transistors may be manufactured by using an oxide such as indium gallium zinc oxide (IGZO) or zinc oxide (ZnO) as an active layer for replacing part of the LTPS, which is referred to as low temperature polycrystalline oxide (LTPO) technology.

With the rapid development of the semiconductor display industry, oxide semiconductive thin film transistors have the advantages of low threshold voltage, good device stability, high optical transmittance, low manufacturing cost, and so on, and thus have received wide attention from researchers at home and abroad.

At present, electron mobility of oxide devices is low, and the issue on how to improve the mobility is an urgent problem to be solved.

Technical Problem

The present disclosure aims to provide a thin film transistor, a method for manufacturing the same, and a display panel, in order to improve electron mobility of the thin film transistor.

Technical Solutions

In one aspect, the present disclosure provides a thin film transistor at least comprising:
a first gate electrode;
a first insulating layer covering the first gate electrode;
an active layer located on the first insulating layer and corresponding to the first gate electrode, wherein the active layer comprises a first active layer, a second active layer located on the first active layer, and a third active layer located on the second active layer;
a source electrode and a drain electrode both located on the first insulating layer and connected to two ends of the active layer, respectively;
a second insulating layer covering the active layer, the source electrode and the drain electrode; and
a second gate electrode located on the second insulating layer;
wherein the first active layer, the second active layer, and the third active layer form a heterostructure.

In some embodiments, a material for forming the first active layer is same as a material for forming the third active layer.

In some embodiments, the material for forming the first active layer and the third active layer comprises indium zinc oxide, and a material for forming the second active layer comprises indium gallium zinc oxide.

In some embodiments, a forbidden band width of the second active layer is different from a forbidden band width of the first active layer and a forbidden band width of the third active layer.

In some embodiments, the first active layer, the second active layer, and the third active layer have a thickness of 5-20 nm, respectively.

In some embodiments, the thin film transistor further comprises:
a first doped region and a second doped region respectively formed in the active layer, wherein the first doped region is connected to the source electrode and the second doped region is connected to the drain electrode.

In some embodiments, the first insulating layer and the second insulating layer have a dielectric constant greater than 10, respectively.

In some embodiments, a material for forming the first insulating layer and a material for forming the second insulating layer comprise hafnium oxide, tantalum oxide, or zirconium oxide.

In another aspect, the present disclosure provides a method of manufacturing a thin film transistor, the method at least comprising:
forming a first gate electrode;
forming a first insulating layer covering the first gate electrode;
forming an active layer on the first insulating layer corresponding to the first gate electrode, wherein the active layer comprises a first active layer, a second active layer on the first active layer, and a third active layer on the second active layer, and the first active layer, the second active layer, and the third active layer form a heterostructure;
forming a source electrode and a drain electrode on the first insulating layer, wherein the source electrode and the drain electrode are connected to two ends of the active layer, respectively;
forming a second insulating layer covering the active layer, the source electrode, and the drain electrode; and
forming a second gate electrode on the second insulating layer.

In some embodiments, after the step of forming the active layer on the first insulating layer corresponding to the first gate electrode, the method further comprises:
forming a first doped region and a second doped region at two ends of the active layer, respectively In still another aspect, the present disclosure provides a display panel at least including the thin film transistor according to the first aspect.

BENEFICIAL EFFECT

The present disclosure provides a thin film transistor, a method of manufacturing the same, a display panel, wherein the thin film transistor at least includes a first gate electrode, a first insulating layer covering the first gate electrode, an active layer located on the first insulating layer and corresponding to the first gate electrode, a source electrode and a drain electrode located on the first insulating layer and respectively connected to two ends of the active layer, a second insulating layer covering the active layer, the source electrode and the drain electrode, and a second gate electrode located on the second insulating layer. The active layer includes a first active layer, a second active layer on the first active layer, and a third active layer on the second active layer, wherein the first active layer, the second active layer, and the third active layer may form a heterostructure. The heterostructure may form two inversion layers or depletion layers, at an interface of the first active layer and the second active layer and at an interface of the second active layer and the third active layer. Therefore, dual channels may be formed, so that the channel electron mobility of the thin film transistor may be improved, thereby improving the on-state current of the device.

BRIEF DESCRIPTION OF THE DRAWINGS

Technical solutions and other beneficial effects of the present disclosure will be apparent from the following detailed description of specific embodiments of the present disclosure, taken in conjunction with the accompanying drawings.

EMBODIMENTS OF THE PRESENT DISCLOSURE

Technical solutions in the embodiments of the present disclosure will be clearly and completely described below in conjunction with the accompanying drawings in the embodiments of the present disclosure. It will be apparent that the described embodiments are only part of the embodiments of the present disclosure, and not all embodiments. Based on the embodiments in the present disclosure, all other embodiments obtained by a person skilled in the art without involving any inventive effort fall within the scope of the present disclosure.

In the description of the present disclosure, it is to be understood that the term "first", "second" are for illustrative purposes only and are not to be construed as indicating or imposing a relative importance or implicitly indicating the number of technical features indicated. Thus, a feature that limited by "first", "second" may expressly or implicitly include one or more the features. In the description of the present disclosure, the meaning of "plural" is two or more, unless otherwise specifically defined.

In the present disclosure, it should be noted that unless otherwise clearly defined and limited, a first feature "on" or "under" a second feature may mean that the first feature directly contacts the second feature, or that the first feature contacts the second feature via an additional feature therebetween instead of directly contacting the second feature. Moreover, the first feature "on", "above", and "over" the second feature may mean that the first feature is right over or obliquely upward over the second feature or only mean that the first feature has a horizontal height higher than that of the second feature. The first feature "under", "below", and "beneath" the second feature may mean that the first feature is right beneath or obliquely downward beneath the second feature or only mean that that horizontal height of the first feature is lower than that of the second feature.

The following description provides various embodiments or examples for implementing various structures of the present disclosure. To simplify the description of the present disclosure, parts and settings of specific examples are described as follows. Certainly, they are only illustrative, and are not intended to limit the present disclosure. Further, reference numerals and reference letters may be repeated in different examples. This repetition is for purposes of simplicity and clarity and does not indicate a relationship of the various embodiments and/or the settings. Furthermore, the present disclosure provides specific examples of various processes and materials, but one of ordinary skill in the art may be aware of other applications of processes and/or the use of other materials.

Figure 1:
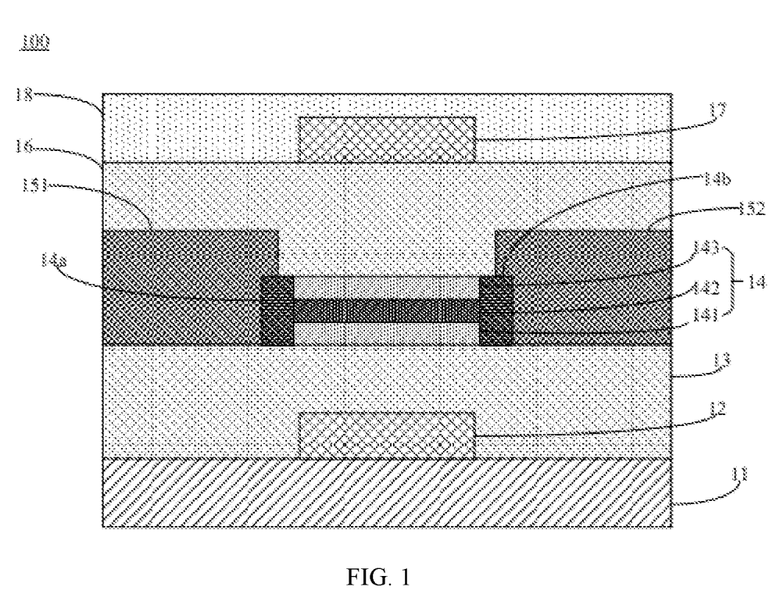
FIG. 1 is a schematic structural view of a thin film transistor according to an embodiment of the present disclosure.

Referring to FIG. 1, showing a schematic structural view of a thin film transistor according to an embodiment of the present disclosure. The thin film transistor 100 can be applied to various displays, such as liquid crystal display (LCD), organic light-emitting diode (OLED), and micro-light-emitting diode (Micro-LED).

The thin film transistor 100 includes a substrate, a buffer layer 11, a first gate electrode 12, a first insulating layer 13, an active layer 14, a source electrode 151 and a drain electrode 152, a second insulating layer 16, a second gate electrode 17, and a protective layer 18. The buffer layer 11 is located on the substrate, the first gate electrode 12 is located on the buffer layer 11, the first insulating layer 13 covers the first gate electrode 12, and the active layer 14 is located on the first insulating layer 13 and corresponds to the first gate electrode 12. The source electrode 151 and the drain electrode 152 are located on the first insulating layer 13 and connected to two ends of the active layer 14, respectively. The second insulating layer 16 covers the active layer 14, the source electrode 151 and the drain electrode 152. The second gate electrode 17 is located on the second insulating layer 16 and corresponds to the active layer 14.

In the present embodiment, the active layer 14 includes a first active layer 141, a second active layer 142 on the first active layer 141, and a third active layer 143 on the second active layer 142. The first active layer 141, the second active layer 142 and the third active layer 143 may form a heterostructure. That is, dual heterojunctions are formed at an interface between the first active layer 141 and the second active layer 142 and at an interface between the second active layer 142 and the third active layer 143, thereby forming dual channels or dual trenches. The heterojunctions can increase electron mobility, and the dual heterojunctions can further increase the electron mobility.

All of the first active layer 141, the second active layer 142, and the third active layer 143 are semi-conductive metal oxides, and have similar crystal structures (or lattice constants), similar atomic spacings, and thermal expansion coefficients. Moreover, a forbidden band width of the first active layer 141 is different from a forbidden band width of the second active layer 142, and the forbidden band width of the second active layer 142 is different from a forbidden band width of the third active layer 143. Thus, a heterojunction may be formed between the first active layer 141 and the second active layer 142, and a heterojunction may be formed between the second active layer 142 and the third active layer 143. A multilayer heterojunction may be referred to as a heterostructure. The heterostructure in this embodiment is a dual-layer heterojunction. It is to be noted that the "forbidden band width" refers to a band gap width (with a unit of electron volt (ev)). Energy of electrons in a solid cannot have continuous values, but has some discontinuous energy bands. To conduct electricity, there must be free electrons or holes. An energy band in which free electrons are present is referred to as a conduction band (capable of conducting electricity), and an energy band in which free holes are present is referred to as a valence band (also capable of conducting electricity). In order for the trapped electrons to become into free electrons or holes, they must gain sufficient energy to transition from the valence band to the conduction band. The minimum of such energy is the forbidden band width.

When both of the first active layer 141 and the second active layer 142 are N-type semiconductors or P-type semiconductors, the formed heterojunction is a homotype heterojunction (P-P junction or N-N junction); when one of the first active layer 141 and the second active layer 142 is an N-type semiconductor and the other is a P-type semiconductor, the formed heterojunction is a heterotype heterojunction (P-N junction). Similarly, when both of the second active layer 142 and the third active layer 143 are N-type semiconductors, the formed heterojunction is a homotype heterojunction; when one of the second active layer 142 and the third active layer 143 is an N-type semiconductor and the other is a P-type semiconductor, the formed heterojunction is a heterotype heterojunction.

In some embodiments, a material for forming the first active layer 141 may be same as a material for forming the third active layer 143, and a material for forming the second active layer 142 may be different from the material for forming both the first active layer 141 and the second active layer 142. For example, the material for forming the first active layer 141 and the third active layer 143 is indium zinc oxide (In—Zn—O), and the material for forming the second active layer 142 is indium gallium zinc oxide (In—Ga—Zn—O). Since both of indium zinc oxide and indium gallium zinc oxide belong to N-type semiconductor, the dual-layer heterojunction formed is a homotype heterojunction (N-N junction). In other embodiments, the material for forming the first active layer 141 may be different from the material for forming the third active layer 143, and the material for forming the second active layer 142 may be different from the material for forming the first active layer 141 and the material for forming the third active layer 143.

In some embodiments, a thickness of the first active layer 141 may range from 5 to 20 nm, a thickness of the second active layer 142 may range from 5 to 20 nm, and a thickness of the third active layer 143 may range from 5 to 20 nm. For example, the thicknesses of the first active layer 141, the second active layer 142, and the third active layer 143 are 5 nm, respectively; alternatively, the thicknesses of the first active layer 141 and the third active layer 143 are 5 nm, respectively, and the thickness of the second active layer 142 is 7 nm.

Further, the thicknesses of the first active layer 141, the second active layer 142, and the third active layer 143 range from 6 to 18 nm, respectively. More further, the thicknesses of the first active layer 141, the second active layer 142, and the third active layer 143 range from 10 to 15 nm, respectively.

The thicknesses of the first active layer 141, the second active layer 142, and the third active layer 143 may be different from each other. The electron mobility decreases as the thicknesses increase within a certain range.

In this embodiment, the first gate electrode 12 and the second gate electrode 17 serve as a bottom gate and a top gate, respectively, so that the thin film transistor 100 is of a dual-gate structure. It has been experimentally verified that the first gate electrode 12 may control a first channel formed at the interface between the first active layer 141 and the second active layer 142, and the second gate electrode 17 may control a second channel formed at the interface between the second active layer 142 and the third active layer 143. The first gate electrode 12 may be applied with a first gate voltage to control conduction of the first channel, and the second gate electrode 17 may be applied with a second gate voltage to control conduction of the second channel. It is to be noted that the first gate electrode 12 and the second gate electrode 17 may be separately controlled, that is, the first gate voltage is different from the second gate voltage. The first gate electrode 12 and the second gate electrode 17 may also be controlled simultaneously, that is, the first gate voltage is the same as the second gate voltage. When the first gate electrode 12 and the second gate electrode 17 are separately controlled, the regulation of overall channel mobility can be more flexible.

By regulating the first gate voltage and the second gate voltage and adjusting the thicknesses of the first active layer 141, the second active layer 142, and the third active layer 143, the electron mobility of dual channels can be regulated.

In some embodiments, the substrate may include one of a glass substrate and a flexible substrate, or a combination thereof. The buffer layer 11 may be a monolayer structure made of one of SiOx, SiNx, and SiNO, or a stacked structure made of SiNx/SiOx.

A material for forming the first gate electrode 12 may be Mo, or Mo/Al, or Mo/Cu, or Mo/Cu/IZO, or IZO/Cu/IZO or Mo/Cu/ITO, or Ni/Cu/Ni, or MoTiNi/Cu/MoTiNi, or NiCr/Cu/NiCr, or CuNb, or the like. A material for forming the second gate electrode 17 may also be Mo, or Mo/Al, or Mo/Cu, or Mo/Cu/IZO, or IZO/Cu/IZO, or Mo/Cu/ITO, or Ni/Cu/Ni, or MoTiNi/Cu/MoTiNi, or NiCr/Cu/NiCr, or CuNb, or the like. It is to be noted that the material for forming the first gate electrode 12 may be the same or different from the material for forming the second gate electrode 17.

Materials for forming the source electrode 151 and the drain electrode 152 may be Mo, or Al/Mo, or Mo/Al/Mo, or Mo/Cu, or Mo/Cu/IZO, or IZO/Cu/IZO, or Mo/Cu/ITO, or Ni/Cu/Ni, or MoTiNi/Cu/MoTiNi, or NiCr/Cu/NiCr, or CuNb, or the like.

A material for forming the protective layer 18 may be an inorganic material such as SiOx, SiNx, Al2O3/SiNx/SiOx, SiOx/SiNx/SiOx, or an organic material such as polymethyl methacrylate.

In some embodiments, the dielectric constants of the first insulating layer 13 and the second insulating layer 16 are greater than 10, respectively. Preferably, the dielectric constants of the first insulating layer 13 and the second insulating layer 16 are greater than 20, respectively. That is, the first insulating layer 13 and the second insulating layer 16 are of a high-K dielectric material, so as to increase the capacitance between the first gate electrode 12 and the source electrode 151 and increase the capacitance between the second gate electrode 17 and the source electrode 151, thereby improving the switching rate and sensitivity of the device. For a certain capacitance, the thicknesses of the first insulating layer 13 and the second insulating layer 16 can be reduced due to the relatively large dielectric constants of the first insulating layer 13 and the second insulating layer 16.

A material for forming the first insulating layer 13 may include one of hafnium oxide ($HfO_2$), zirconium oxide ($ZrO_2$), and tantalum oxide ($Ta_2O_5$), or any combination thereof. A material for forming the second insulating layer 16 may also include one of hafnium oxide ($HfO_2$), zirconium oxide ($ZrO_2$), and tantalum oxide ($Ta_2O_5$), or any combination thereof. It is to be noted that the materials of the first insulating layer 13 and the second insulating layer 16 may be the same or different.

In some embodiments, the thin film transistor 100 may further include a first doped region 14a and a second doped region 14b. The first doped region 14a and the second doped region 14b are formed in the active layer 14, specifically at two ends of the active layer 14. In other words, the active layer 14 may include a first doped region and a second doped region located at two ends of the active layer 14. The first doped region 14a is connected to the source electrode 151, and the second doped region 14b is connected to the drain electrode 152. The first doped region 14a and the second doped region 14b may have N-type doping ions therein to respectively electrically connect to the source electrode 151 and the drain electrode 152, so that a contact resistance of the source electrode 151 and the drain electrode 152 with the active layer 14 can be reduced.

An embodiment of the present disclosure provides a thin film transistor 100, including a first gate electrode 12, a first insulating layer 13 covering the first gate electrode 12, an active layer 14 located on the first insulating layer 13 and corresponding to the first gate electrode 12, a source electrode 151 and a drain electrode 152 located on the first insulating layer 13 and connected respectively to two ends of the active layer 14, a second insulating layer 16 covering the active layer 14, the source electrode 151 and the drain electrode 152, and a second gate electrode 17 located on the second insulating layer 16. The active layer 14 includes a first active layer 141, a second active layer 142 located on the first active layer 141, and a third active layer 143 located on the second active layer 142. The first active layer 141, the second active layer 142, and the third active layer 143 may form a heterostructure. That is, dual channels may be formed at an interface between the first active layer 141 and the second active layer 142 and at an interface between the second active layer 142 and the third active layer 143, thereby improving the channel electron mobility of the thin film transistor 100 and improving the on-state current of the device.

Figure 2:
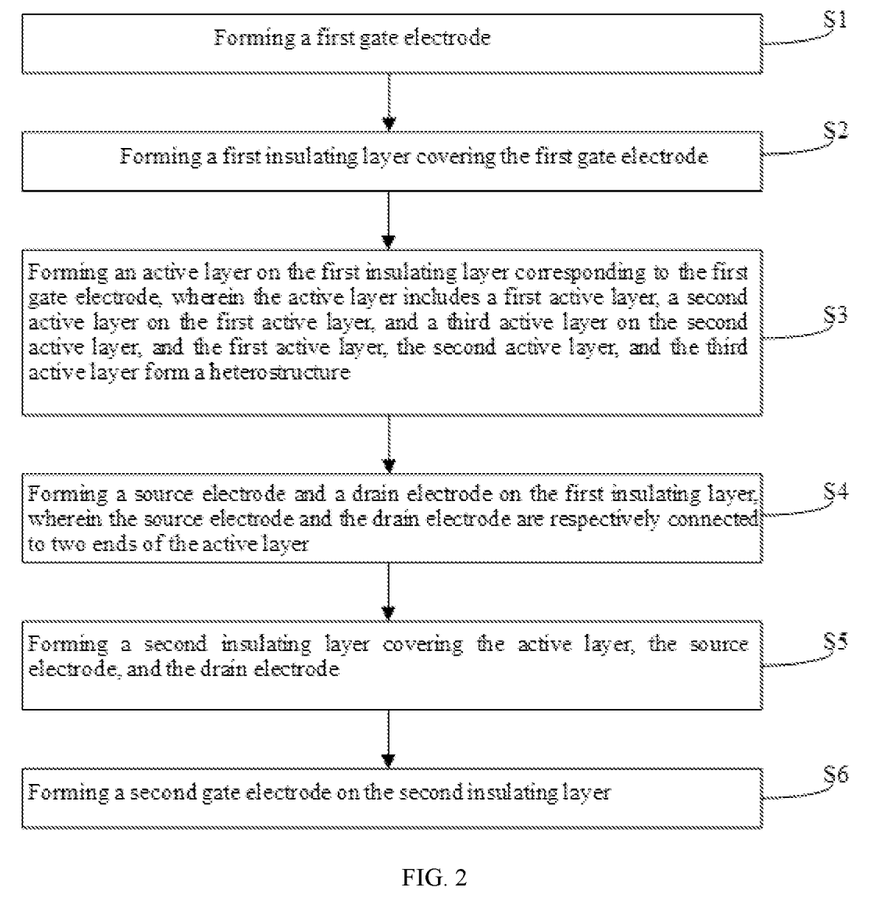
FIG. 2 is a schematic flow diagram of a method for manufacturing a thin film transistor according to an embodiment of the present disclosure.

Referring to FIG. 2, it is a schematic flow diagram of a method for manufacturing a thin film transistor according to an embodiment of the present disclosure. Referring also to FIGS. 3a-3k, these are schematic structural views of a thin film transistor in a manufacturing process according to an embodiment of the present disclosure. The manufacturing method may include the following steps S1-S6.

Figure 3A:
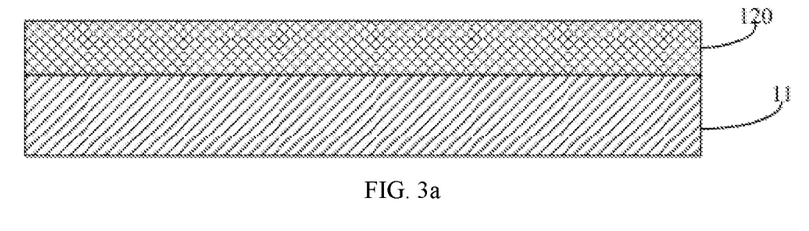
FIGS. 3a-3k are schematic structural views of a thin film transistor in a manufacturing process according to an embodiment of the present disclosure.
Figure 3B:
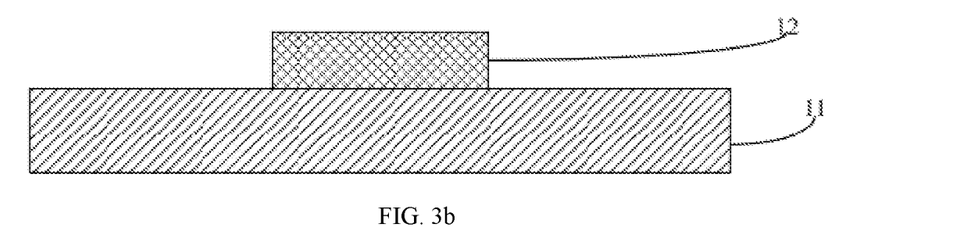

Reference is made to step S1 in FIG. 2 and FIGS. 3a-3b.

Step S1: Forming a first gate electrode 12.

Before forming the first gate electrode 12, a substrate (not shown) is prepared. A buffer layer 11 is formed on the substrate using a deposition process, which may be chemical vapor deposition (CVD) or physical vapor deposition (PVD). Next, a first gate layer 120 is deposited on the buffer layer 11 (as shown in FIG. 3a), and then the first gate layer 120 is etched using a mask to form the first gate electrode 12 as shown in FIG. 3b.

Figure 3C:
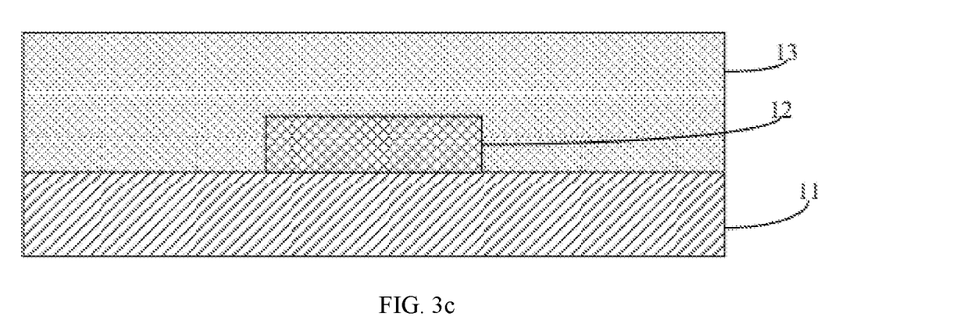

Reference is made to step S2 in FIG. 2 and FIG. 3c.

Step S2: Forming a first insulating layer 13 covering the first gate electrode 12.

Specifically, the first insulating layer 13 may be deposited on the buffer layer 11 and the first gate electrode 12. A material for forming the first insulating layer 13 may be a high-K dielectric material such as hafnium oxide, tantalum oxide, or zirconium oxide. A dielectric constant of the first insulating layer 13 is greater than 10.

Figure 3D:
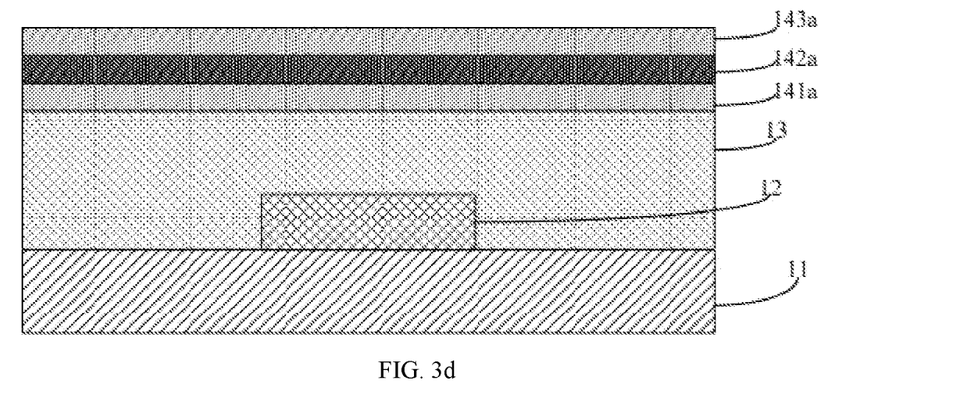
Figure 3E:
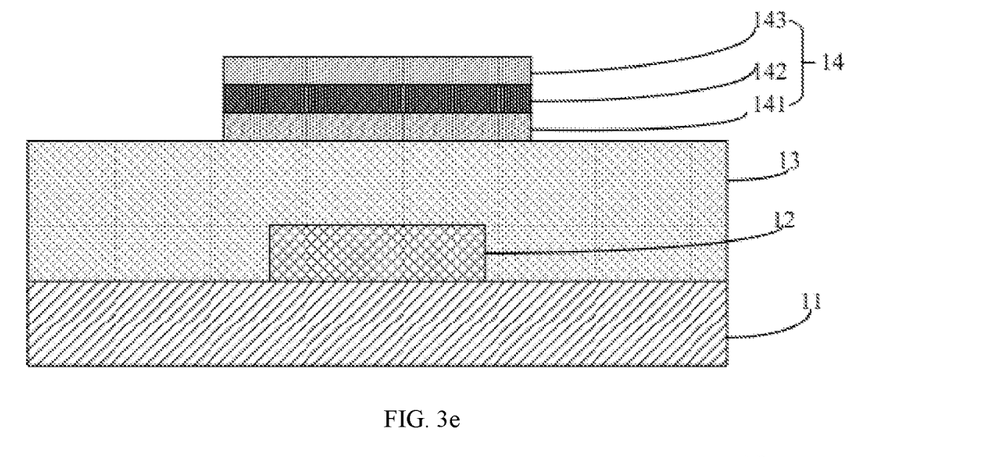

Reference is made to step S3 in FIG. 2 and FIGS. 3d-3e.

Step S3: Forming an active layer 14 on the first insulating layer 13 corresponding to the first gate electrode 12, wherein the active layer 14 includes a first active layer 141, a second active layer 142 on the first active layer 141, and a third active layer 143 on the second active layer 142, and the first active layer 141, the second active layer 142, and the third active layer 143 form a heterostructure.

Specifically, as shown in FIG. 3d, a first active material 141a, a second active material 142a, and a third active material 143a are sequentially deposited on the first insulating layer 13. As shown in FIG. 3e, the first active material 141a, the second active material 142a, and the third active material 143a are then etched using a mask to respectively form the first active layer 141, the second active layer 142, and the third active layer 143 above the corresponding first gate electrode 12.

A material for forming the first active layer 141 is different from a material for forming the second active layer 142, and a material for forming the second active layer 142 is different from s material for forming the third active layer 143. A band gap width of the second active layer 142 is different from a band gap width of the first active layer 141 and a band gap width of the third active layer 143. The thicknesses of the first active layer 141, the second active layer 142, and the third active layer 143 may be 5-20 nm, respectively.

In one embodiment, the material for forming the first active layer 141 may be same as the material for forming the third active layer 143. For example, the material for forming the first active layer 141 and the third active layer 143 includes indium zinc oxide, and the material for forming the second active layer 142 includes indium gallium zinc oxide.

Figure 3F:
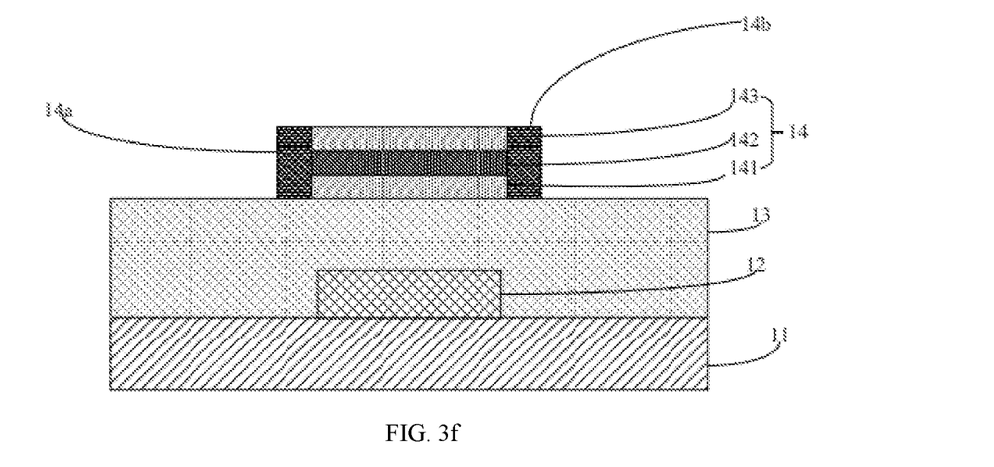

As shown in FIG. 3f, after step S3, the method of manufacturing the thin film transistor may further include forming a first doped region 14a and a second doped region 14b at two ends of the active layer 14, respectively. Specifically, an N-type ion implantation process may be performed on the two ends of the active layer 14 to form a first doped region 14a and a second doped region 14b. The first doped region 14a and the second doped region 14b are heavily doped regions.

Figure 3G:
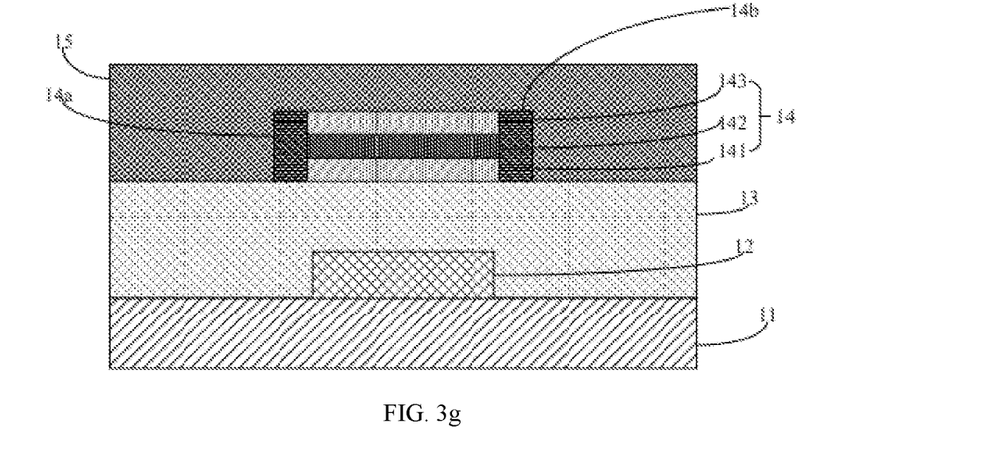
Figure 3H:
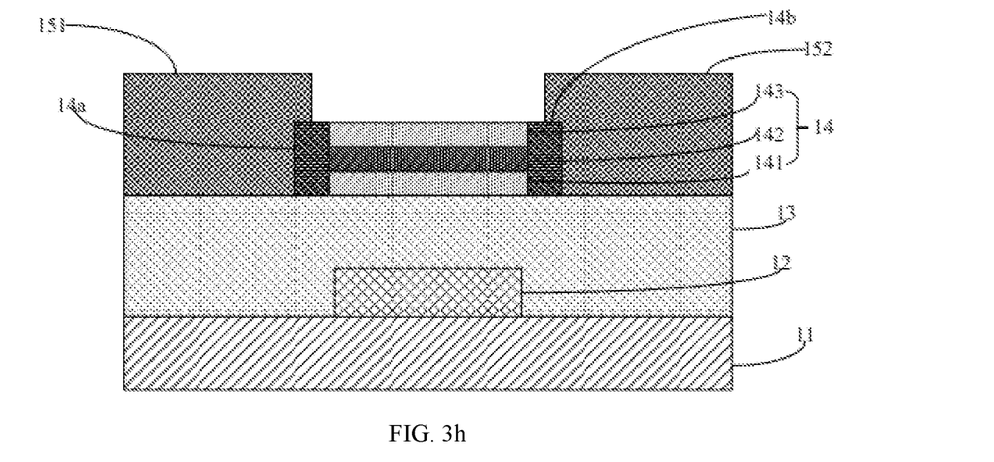

Reference is made to step S4 in FIG. 2 and FIGS. 3g-3h.

In step S4, a source electrode 151 and a drain electrode 152 are formed on the first insulating layer 13. The source electrode 151 and the drain electrode 152 are respectively connected to the two ends of the active layer 14.

As shown in FIG. 3g, a metal layer 15 is first deposited on the active layer 14 and the first insulating layer 13. A material for forming the metal layer 15 may be Mo, or Al/Mo, or Mo/Al/Mo, or Mo/Cu, or Mo/Cu/IZO, or IZO/Cu/IZO, or Mo/Cu/ITO, or Ni/Cu/Ni, or MoTiNi/Cu/Mo-TiNi, or NiCr/Cu/NiCr, or CuNb, or the like. As shown in FIG. 3h, the metal layer 15 is then subjected to an etching process using a mask to form a separated source electrode 151 and drain electrode 152, wherein the source electrode 151 and the drain electrode 152 are respectively located at the two ends of the active layer 14, so that the source electrode 151 is connected to the first doped region 14a and the drain electrode 152 is connected to the second doped region 14b.

Figure 3I:
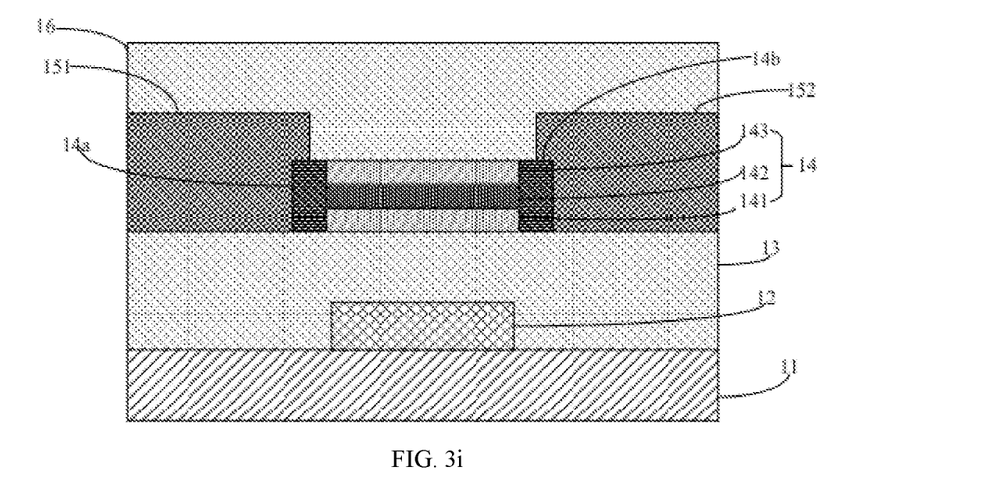

Reference is made to step S5 in FIG. 2 and FIG. 3i.

Step S5: Forming a second insulating layer 16 covering the active layer 14, the source electrode 151, and the drain electrode 152.

The second insulating layer 16 may be deposited on the active layer 14, the source electrode 151, and the drain electrode 152. A material for forming the second insulating layer 16 may be a high-K dielectric material such as hafnium oxide, tantalum oxide, or zirconium oxide. A dielectric constant of the second insulating layer 16 is greater than 10.

Figure 3J:
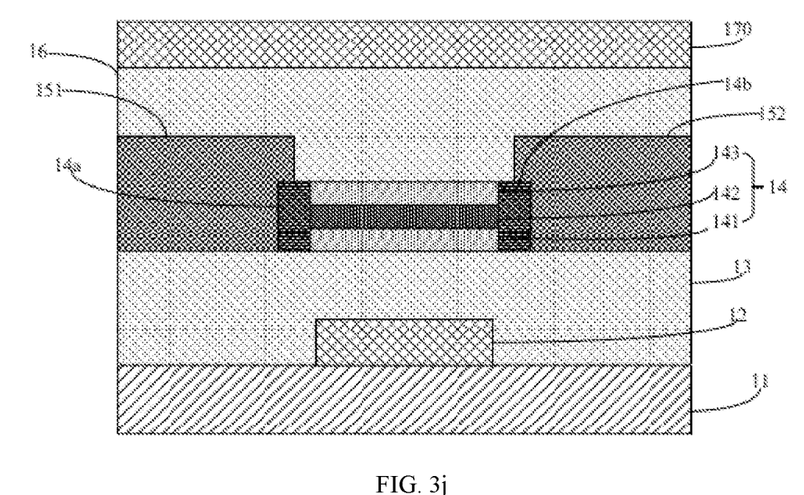
Figure 3K:
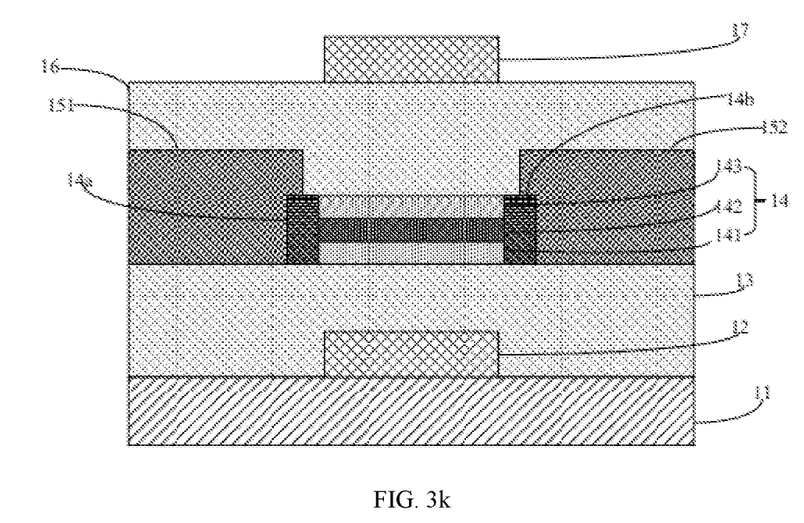

Reference is made to step S6 in FIG. 2 and FIGS. 3j-3k.

Step S6: Forming a second gate electrode 17 on the second insulating layer 16.

The specific steps of forming the second gate electrode 17 may be the same as the specific steps of forming the first gate electrode 12, for example, including: depositing a second gate material 170 (as shown in FIG. 3*j*), and then etching the second gate material 170 to form the second gate electrode 17 above the corresponding active layer 14 (as shown in FIG. 3*k*).

After step S6, referring to FIG. 1, the method for manufacturing the thin film transistor may further include forming a protective layer 18 covering the second insulating layer 16 and the second gate electrode 17.

Embodiments of the present disclosure provide the method for manufacturing the thin film transistor 100, in which the first active layer 141, the second active layer 142, and the third active layer 143 are stacked to form a heterostructure having a dual heterojunction, thereby forming a dual-channel thin film transistor, improving the channel electron mobility, and improving the on-state current of the device.

Embodiments of the present disclosure further provide a display panel including the thin film transistor in any one of the above-described embodiments, thereby having the same beneficial effect as the thin film transistor in any one of the above-described embodiments, and details are not described herein.

The description of the above embodiments is only used to help understand the technical solutions and core ideas of the present disclosure; those of ordinary skill in the art should understand that it is still possible to modify the technical solutions recorded in the foregoing embodiments, or equivalently replace some of the technical features; and these modifications or replacements do not cause the essence of the corresponding technical solutions to deviate from the scope of the technical solutions of the embodiments of the present disclosure.

What is claimed is:

1. A thin film transistor, at least comprising:
   a first gate electrode;
   a first insulating layer covering the first gate electrode;
   an active layer located on the first insulating layer and corresponding to the first gate electrode, wherein the active layer comprises a first active layer, a second active layer located on the first active layer, and a third active layer located on the second active layer;
   a source electrode and a drain electrode both located on the first insulating layer and connected to two ends of the active layer, respectively, wherein the source electrode and the drain electrode are disposed on a same layer as the active layer;
   a second insulating layer covering the active layer, the source electrode and the drain electrode; and
   a second gate electrode located on the second insulating layer;
   wherein the first active layer, the second active layer, and the third active layer form a heterostructure, and the second insulating layer is in direct contact with the active layer, the source electrode, the drain electrode, and the second gate electrode.

2. The thin film transistor according to claim 1, wherein a material for forming the first active layer is same as a material for forming the third active layer.

3. The thin film transistor according to claim 2, wherein the material for forming the first active layer and the third active layer comprises indium zinc oxide, and a material for forming the second active layer comprises indium gallium zinc oxide.

4. The thin film transistor according to claim 1, wherein a forbidden band width of the second active layer is different from a forbidden band width of the first active layer and a forbidden band width of the third active layer.

5. The thin film transistor according to claim 1, wherein the first active layer, the second active layer, and the third active layer have a thickness of 5-20 nm, respectively.

6. The thin film transistor according to claim 1, wherein the thin film transistor further comprises:
   a first doped region and a second doped region respectively formed in the active layer, wherein the first doped region is connected to the source electrode and the second doped region is connected to the drain electrode.

7. The thin film transistor according to claim 6, wherein the first doped region and the second doped region comprise N-type doping ions.

8. A display panel at least comprising the thin film transistor according to claim 1.

9. The thin film transistor according to claim 1, wherein the first insulating layer and the second insulating layer have a dielectric constant greater than 10, respectively.

10. The thin film transistor according to claim 9, wherein a material for forming the first insulating layer and a material for forming the second insulating layer comprise hafnium oxide, tantalum oxide, or zirconium oxide.

11. A method of manufacturing a thin film transistor, at least comprising:
    forming a first gate electrode;
    forming a first insulating layer covering the first gate electrode;
    forming an active layer on the first insulating layer corresponding to the first gate electrode, wherein the active layer comprises a first active layer, a second active layer on the first active layer, and a third active layer on the second active layer, and the first active layer, the second active layer, and the third active layer form a heterostructure;
    forming a source electrode and a drain electrode on the first insulating layer, wherein the source electrode and the drain electrode are connected to two ends of the active layer, respectively, wherein the source electrode and the drain electrode are disposed on a same layer as the active layer;
    forming a second insulating layer covering the active layer, the source electrode, and the drain electrode; and
    forming a second gate electrode on the second insulating layer,
    wherein the second insulating layer is in direct contact with the active layer, the source electrode, the drain electrode, and the second gate electrode.

12. The method of manufacturing the thin film transistor according to claim 11, wherein after the step of forming the active layer on the first insulating layer corresponding to the first gate electrode, the method further comprises:
    forming a first doped region and a second doped region at two ends of the active layer, respectively.

13. The method of manufacturing the thin film transistor according to claim 11, wherein a material for forming the first active layer is same as a material for forming the third active layer.

14. The method of manufacturing the thin film transistor according to claim 13, wherein the material for forming the first active layer and the third active layer comprises indium zinc oxide, and a material for forming the second active layer comprises indium gallium zinc oxide.

15. The method of manufacturing the thin film transistor according to claim 11, wherein a forbidden band width of the second active layer is different from a forbidden band width of the first active layer and a forbidden band width of the third active layer.

16. The method of manufacturing the thin film transistor according to claim 11, wherein the first active layer, the second active layer, and the third active layer have a thickness of 5-20 nm, respectively.

17. The method of manufacturing the thin film transistor according to claim 11, wherein the first insulating layer and the second insulating layer have a dielectric constant greater than 10, respectively.

18. The method of manufacturing the thin film transistor according to claim 17, wherein a material for forming the first insulating layer and a material for forming the second insulating layer comprise hafnium oxide, tantalum oxide, or zirconium oxide.

\* \* \* \* \*